(12) United States Patent
Andry et al.

(10) Patent No.: US 8,298,917 B2
(45) Date of Patent: Oct. 30, 2012

(54) PROCESS FOR WET SINGULATION USING A DICING SINGULATION STRUCTURE

(75) Inventors: Paul S. Andry, Yorktown Heights, NY (US); Timothy H. Daubenspeck, Colchester, VT (US); Jeffrey P. Gambino, Westford, VT (US); Edmund J. Sprogis, Underhill, VT (US); Cornelia K. Tsang, Mohegan Lake, NY (US)

(73) Assignee: International Business Machines Corporation, Armonk, NY (US)

(*) Notice: Subject to any disclaimer, the term of this patent is extended or adjusted under 35 U.S.C. 154(b) by 458 days.

(21) Appl. No.: 12/423,254

(22) Filed: Apr. 14, 2009

(65) Prior Publication Data
US 2010/0261335 A1    Oct. 14, 2010

(51) Int. Cl.
*H01L 23/544* (2006.01)
(52) U.S. Cl. ................. 438/462; 438/464; 257/E23.179
(58) Field of Classification Search .................. 438/460, 438/462, 464, 465, 113, 114; 257/E23.001, 257/E23.179
See application file for complete search history.

(56) References Cited

U.S. PATENT DOCUMENTS

| | | | |
|---|---|---|---|
| 3,997,964 A | 12/1976 | Holbrook et al. | |
| 4,236,296 A | 12/1980 | Woolhouse et al. | |
| 5,757,081 A * | 5/1998 | Chang et al. | 257/778 |
| 6,972,243 B2 * | 12/2005 | Patel | 438/461 |
| 7,102,238 B2 * | 9/2006 | Noma et al. | 257/777 |
| 7,112,470 B2 | 9/2006 | Daubenspeck et al. | |
| 7,129,114 B2 | 10/2006 | Akram | |
| 7,316,940 B2 | 1/2008 | Daubenspeck et al. | |
| 7,374,971 B2 * | 5/2008 | Yuan et al. | 438/113 |
| 7,569,409 B2 * | 8/2009 | Lin et al. | 438/33 |
| 7,674,689 B2 * | 3/2010 | Schneegans et al. | 438/462 |
| 7,759,779 B2 * | 7/2010 | Okada et al. | 257/678 |
| 8,178,421 B2 * | 5/2012 | Kikuchi | 438/462 |
| 2001/0001215 A1 | 5/2001 | Siniaguine et al. | |
| 2002/0013061 A1 | 1/2002 | Siniaguine et al. | |
| 2003/0230805 A1 * | 12/2003 | Noma et al. | 257/737 |
| 2004/0076797 A1 * | 4/2004 | Zilber et al. | 428/137 |
| 2004/0161920 A1 * | 8/2004 | Noma | 438/620 |

(Continued)

OTHER PUBLICATIONS

Kumagai, et al., "Advanced Dicing Technology for Semiconductor Wafer-Stealth Dicing," IEEE Transactions on Semiconductor Manufacturing, vol. 20, No. 3, Aug. 2007, pp. 259-265.

*Primary Examiner* — Hsien Ming Lee
*Assistant Examiner* — Michele Fan
(74) *Attorney, Agent, or Firm* — Gibb & Riley, LLC; Richard M. Kotulak, Esq.

(57) ABSTRACT

A method includes receiving at least one wafer having a front side and a backside, where the front side has a plurality of integrated circuit chips thereon. The backside of the wafer is thinned, a pattern of material is removed from the backside of the wafer to form a plurality of dicing trenches. Each of the dicing trenches are positioned opposite a location on the front side of the wafer that corresponds to edges of each of the plurality of chips. The dicing trenches are filled with a filler material and a dicing support is attached to a front side of the wafer. The filler material is removed from the dicing trenches, and a force is applied to the dicing support to separate each of the plurality of chips on the wafer from each other along the dicing trenches.

19 Claims, 5 Drawing Sheets

U.S. PATENT DOCUMENTS

| | | | |
|---|---|---|---|
| 2004/0266138 A1* | 12/2004 | Kajiyama et al. | 438/462 |
| 2005/0009238 A1* | 1/2005 | Okigawa | 438/119 |
| 2005/0031822 A1* | 2/2005 | Aihara et al. | 428/40.1 |
| 2005/0048740 A1* | 3/2005 | Noma et al. | 438/460 |
| 2005/0176169 A1* | 8/2005 | Koizumi et al. | 438/106 |
| 2006/0051949 A1* | 3/2006 | Nemoto | 438/597 |
| 2006/0079019 A1* | 4/2006 | Kim | 438/106 |
| 2007/0145420 A1* | 6/2007 | Okada et al. | 257/228 |
| 2007/0221613 A1 | 9/2007 | Gutsche et al. | |
| 2007/0246821 A1* | 10/2007 | Lu et al. | 257/701 |
| 2007/0275541 A1 | 11/2007 | Harris et al. | |
| 2008/0003720 A1* | 1/2008 | Lu et al. | 438/113 |
| 2008/0102604 A1* | 5/2008 | Prabhu et al. | 438/461 |
| 2008/0213976 A1* | 9/2008 | Farnworth | 438/460 |
| 2008/0272368 A1* | 11/2008 | Do et al. | 257/40 |
| 2008/0272476 A1* | 11/2008 | Do et al. | 257/686 |
| 2008/0274603 A1* | 11/2008 | Do et al. | 438/462 |
| 2009/0026610 A1* | 1/2009 | Kitagawa et al. | 257/737 |
| 2009/0079038 A1* | 3/2009 | Schneegans et al. | 257/620 |
| 2009/0197395 A1* | 8/2009 | Nakamura et al. | 438/463 |
| 2010/0038668 A1* | 2/2010 | Noma | 257/98 |
| 2010/0283127 A1* | 11/2010 | Leib | 257/620 |

* cited by examiner

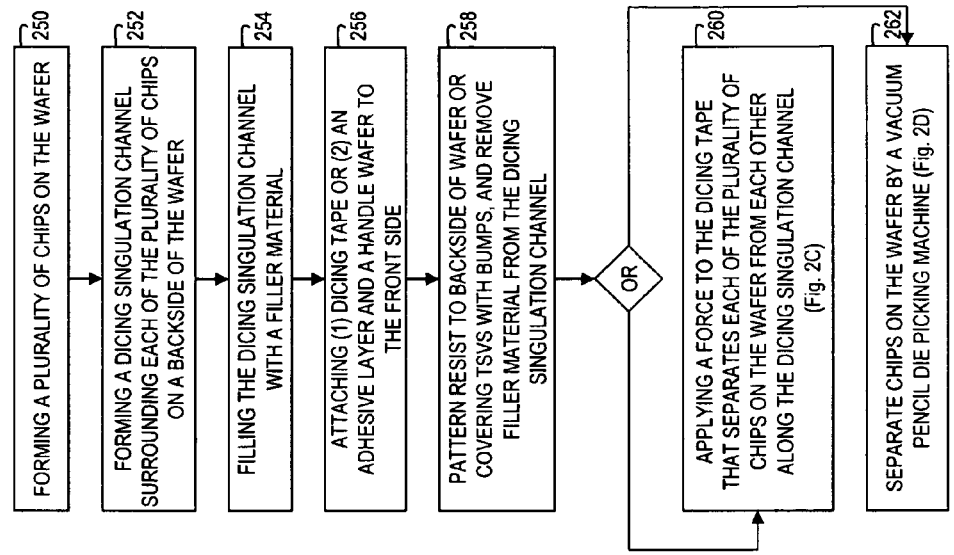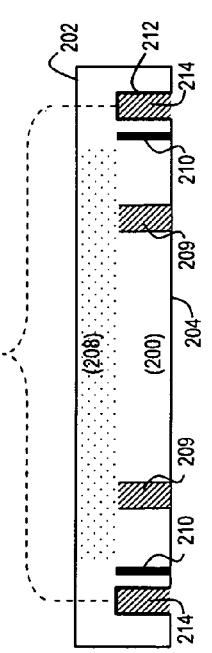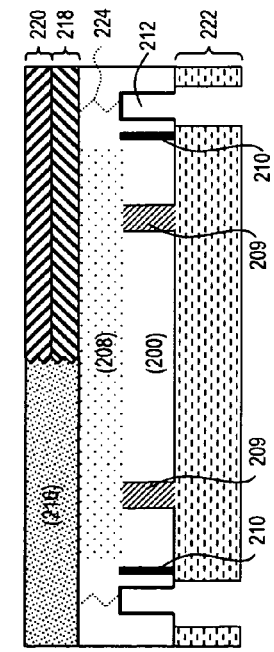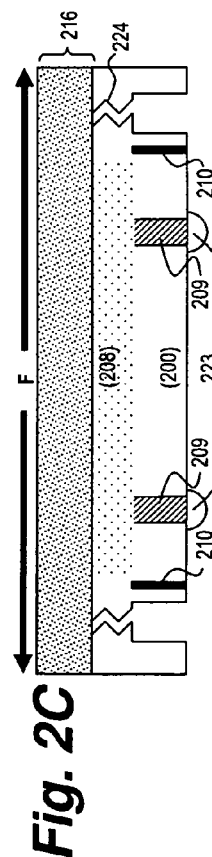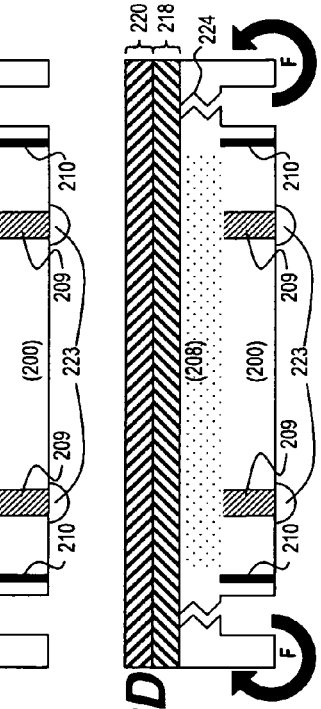

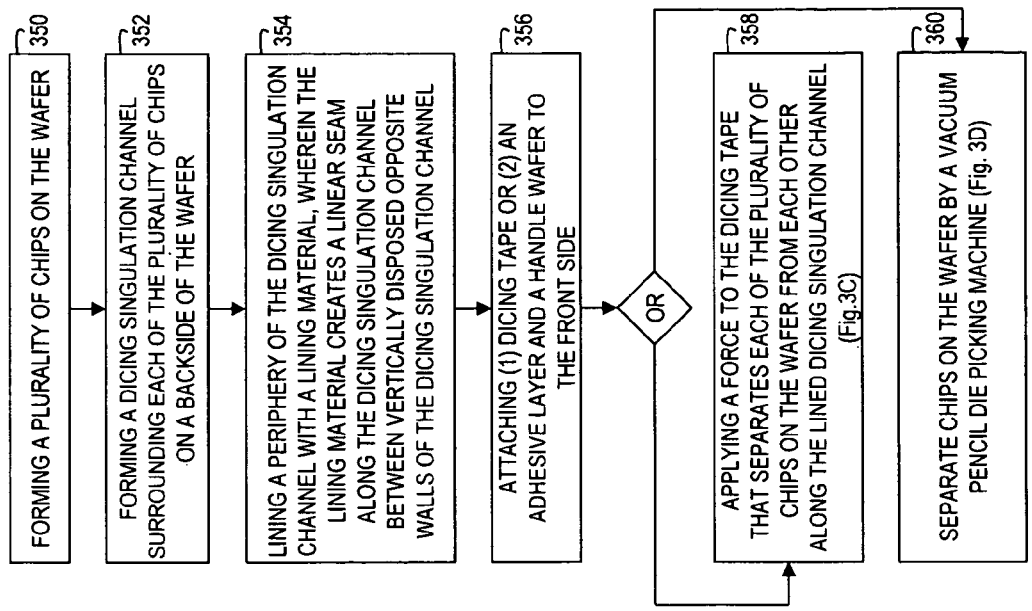

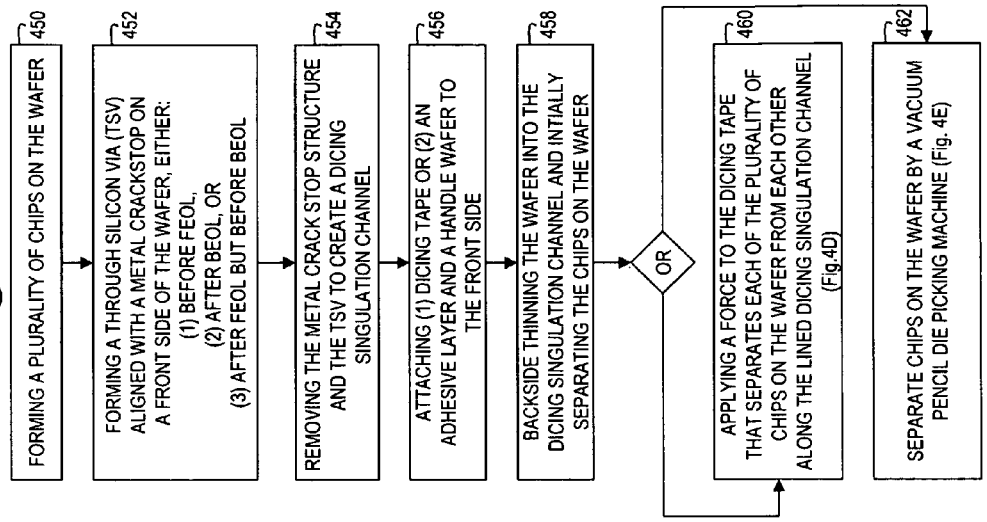
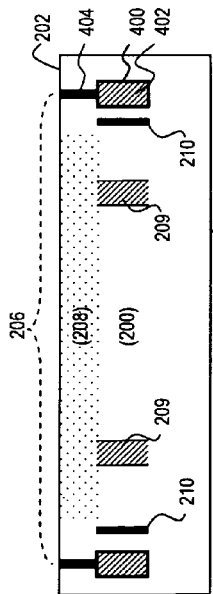
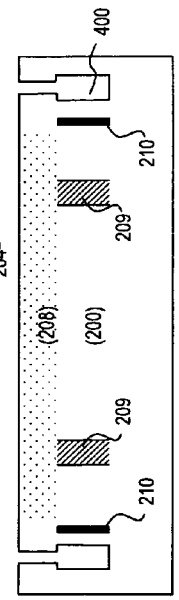
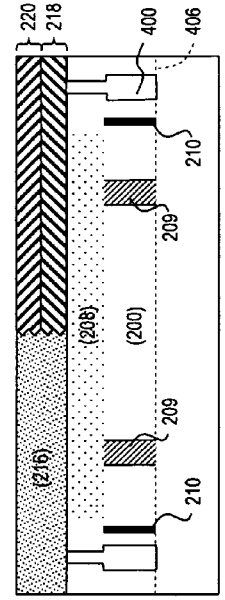
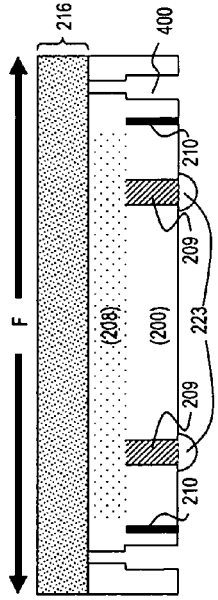
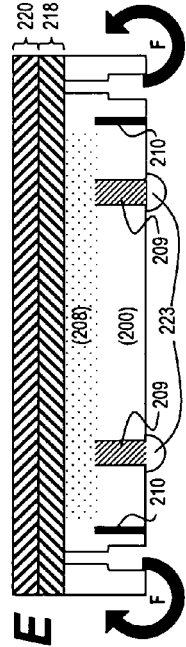
Fig. 4A
Fig. 4B
Fig. 4C
Fig. 4D
Fig. 4E
Fig. 4F

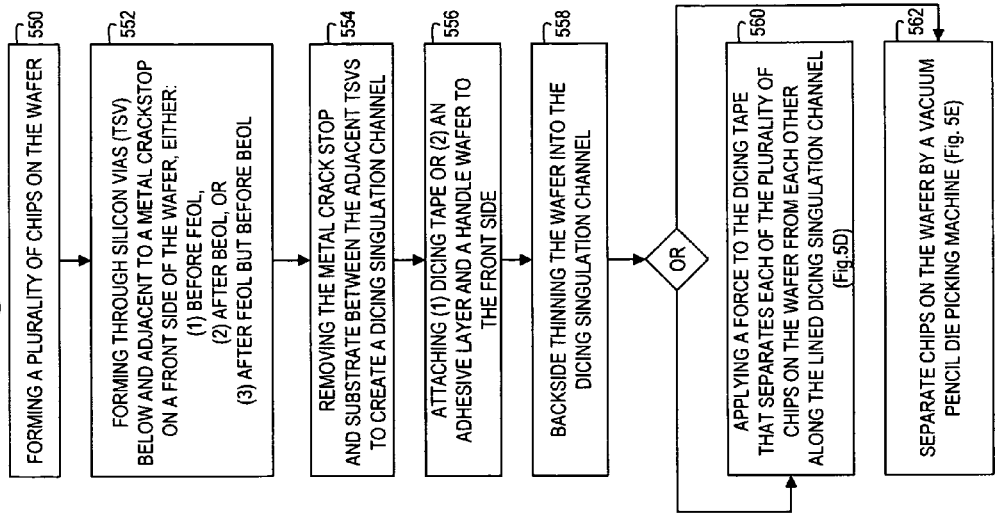
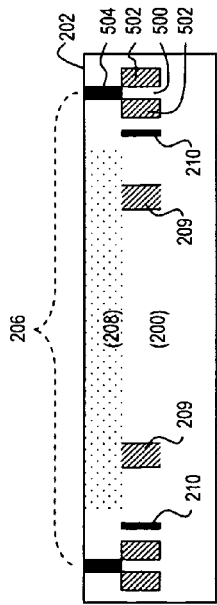
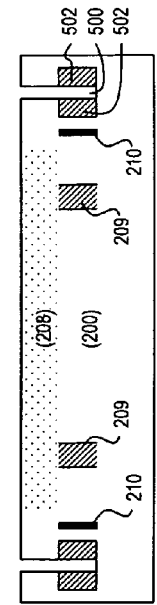
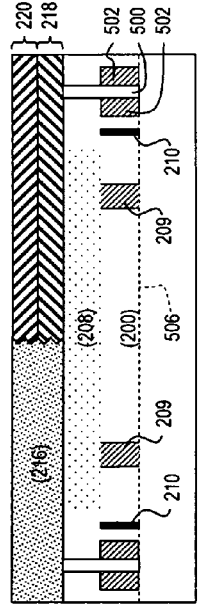
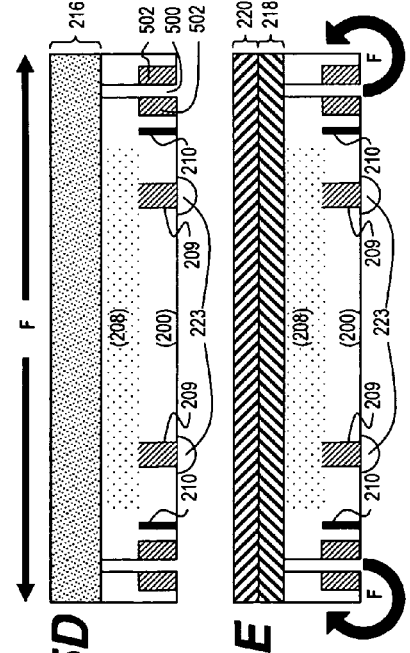

PROCESS FOR WET SINGULATION USING A DICING SINGULATION STRUCTURE

BACKGROUND OF THE INVENTION

1. Field of the Invention

The present invention generally relates to a method for simultaneously dicing a plurality of chips on a wafer to achieve singulation (separation) of semiconductor chip products from parent wafers at the end of the wafer level fabrication process.

2. Description of the Related Art

The industry standard methodology for dicing semiconductor wafers into chips currently involves a mechanical saw that has a blade width that is typically on the order of 50 μm. The mechanical saw can be used alone, or for more advanced technology products, in combination with a laser that cuts an initial scribe line at the edge of each die in an effort to limit the probability of long-range saw-induced crack propagation from the kerf area into the chip edge. For modern and advanced generation Back-End-Of-The-Line (BEOL) technology products, the integration of copper and Low-K dielectric materials results in a mechanically fragile structure comprised of sensitive interfaces which can be easily compromised by chip edge damage, despite the use of metal-stack crackstop structure. This can lead to serious reliability problems, particularly in high stress plastic-packaged parts which employ Controlled Collapse Chip Connection (C4) solder connections.

In 3-D chip stacking applications, integrated circuit wafers are typically thinned by a backside grind process to 100 um or less prior to the dicing singulation process. The dicing of these thinned structures is even more delicate an operation than for the full ~780 μm wafer.

The blade width of the dicing saw together with the room required for the standard moisture oxidation barrier/crackstop structure drive a requirement for a sizable kerf width and chip edge space allocation (in layout) to accommodate them. Even so, the attendant reliability risk due to mechanically induced chip edge cracking remains a concern.

Conventional processes for 3-D chip stacking application currently use the idea of a polysilicon "moat" around the chip, to function merely as a crackstop. In this invention, this original crackstop structure is supplemented with a separate crackstop structure of a particular design (i.e., having a vertical coincidence w/BEOL (back-end-of-line) chip crackstop structure), that is used to effect die singulation. The original polysilicon crackstop, may still be used in addition as a crackstop or may be eliminated altogether.

There is a need for a singulation process that does not require the use of a mechanical saw. This is eminently possible for the chip stacking application, in which wafer processing is done on both sides of the wafer as part of the normal process for the creation of through-silicon vias (TSVs).

SUMMARY OF THE INVENTION

In view of the foregoing and other exemplary problems, drawbacks, and disadvantages of the conventional methods and structures, the exemplary aspects of the present invention provide an advantage in smaller chip size, less damage due to singulation, lower fabrication and scrap costs, and the elimination for a need for metal crackstop structure.

An exemplary method includes receiving at least one wafer having a front side and a backside, where the front side has a plurality of integrated circuit chips thereon. The backside of the wafer is thinned, a pattern of material is removed from the backside of the wafer to form a plurality of dicing trenches. Each of the dicing trenches are positioned opposite a location on the front side of the wafer that corresponds to edges of each of the plurality of chips. The dicing trenches are filled with a filler material and a dicing support is attached to a front side of the wafer. The filler material is removed from the dicing trenches, and a force is applied to the dicing support to separate each of the plurality of chips on the wafer from each other along the dicing trenches.

The dicing trenches may be approximately 50 nm in width. The filler material may include tungsten, polysilicon or polyimide. The force applied to the dicing support physically separates a portion of the wafer along the dicing trenches. Physical separation occurs between an interior portion of the dicing trenches and the front side of the wafer immediately above the dicing trenches. The filler material removed from the dicing trenches may be performed by a wet etch process. The dicing trenches corresponding to rectangular edges of the wafers forming a continuous and separate rectangular trench corresponding to each of the chips, each chip on the front side of the wafer having a corresponding rectangular trench on the backside of the wafer matching a shape and position of the edges of the chips on the front side of the wafer.

Another exemplary aspect includes a method that receives at least one wafer, the wafer having a front side and a backside, the front side having a plurality of integrated circuit chips thereon. The backside of the wafer is thinned and a pattern of material is removed from the backside of the wafer to form a plurality of dicing trenches, wherein the dicing trenches are aligned to contact with at least one metal crackstop structure disposed on a front side of the wafer. The dicing trenches are filled with a filler material, and a dicing support is attached to a front side of the wafer. The filler material is removed from the dicing trenches, and a force is applied to the dicing support to separate each of the plurality of chips on the wafer from each other along the dicing trenches.

With its unique and novel features, the present invention provides an advantage in smaller chip fabrication size, less damage due to singulation, lower fabrication and scrap costs, and the elimination for a need for metal crackstop.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 2A illustrates an example of a first embodiment of the present invention;

FIG. 2B further illustrates an example of a first and second alternative configuration of the first embodiment of the present invention;

FIG. 2C further illustrates the first alternative configuration of the first embodiment of the present invention;

FIG. 2D further illustrates the second alternative configuration of the first embodiment of the present invention;

FIG. 2E illustrates a logic flowchart of a method of the first embodiment of the present invention;

FIG. 3A illustrates an example of a second embodiment of the present invention;

FIG. 3B further illustrates an example of a first and second alternative configuration of the second embodiment of the present invention;

FIG. 3C further illustrates the first alternative configuration of the first embodiment of the present invention;

FIG. 3D further illustrates the second alternative configuration of the first embodiment of the present invention;

FIG. 3E illustrates a logic flowchart of a method of the first embodiment of the present invention;

FIG. 4A illustrates an example of a third embodiment of the present invention;

FIG. 4B further illustrates the example of third embodiment of the present invention;

FIG. 4C further illustrates an example of a first and second alternative configuration of the third embodiment of the present invention;

FIG. 4D further illustrates the first alternative configuration of the third embodiment of the present invention;

FIG. 4E further illustrates the second alternative configuration of the third embodiment of the present invention;

FIG. 4F illustrates a logic flowchart of a method of the third embodiment of the present invention;

FIG. 5A illustrates an example of a fourth embodiment of the present invention;

FIG. 5B further illustrates the example of fourth embodiment of the present invention;

FIG. 5C further illustrates an example of a first and second alternative configuration of the fourth embodiment of the present invention;

FIG. 5D further illustrates the first alternative configuration of the fourth embodiment of the present invention;

FIG. 5E further illustrates the second alternative configuration of the forth embodiment of the present invention; and FIG. 5F illustrates a logic flowchart of a method of the fourth embodiment of the present invention.

DETAILED DESCRIPTION OF EXEMPLARY EMBODIMENTS OF THE INVENTION

Figure 1:
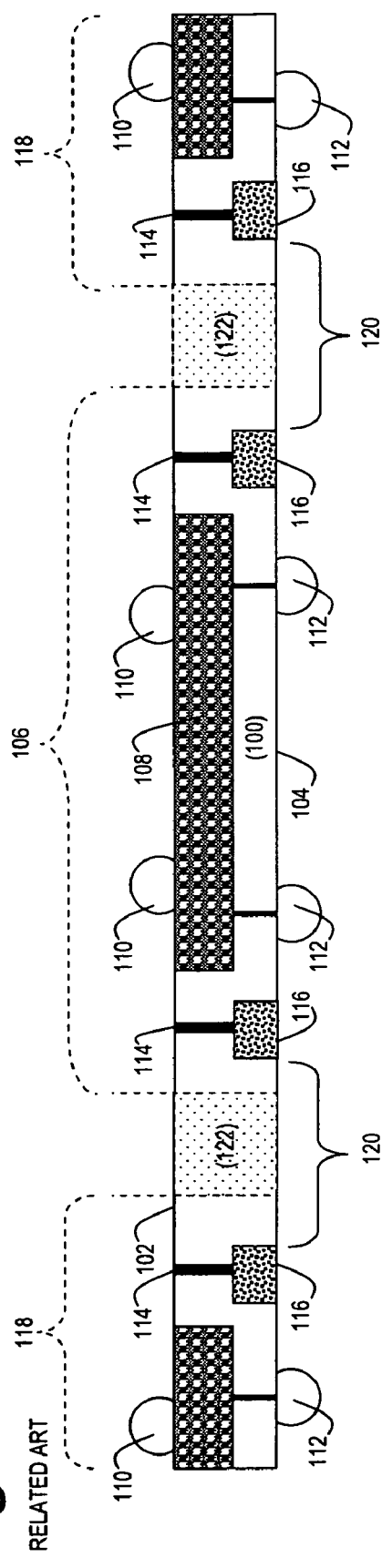
FIG. 1 illustrates an example of a plurality of semiconductor chips fabricated on a single wafer.

FIG. 1 illustrates an example of a plurality of semiconductor chips fabricated on a single wafer using a typical dicing blade of 50 μm. A semiconductor wafer 100 having a front side 102 and a backside 104 having a plurality of semiconductor chips (for example, at 106) fabricated thereupon. Each semiconductor chip has a series of fabricated components 108 (not shown in detail) and may have a top surface mount of ball electrodes 110 and bottom surface mounted ball electrodes 112 connected to the electronic components 108 via electrical conductors. A metal crackstop 114 and/or polysilicon crackstop 118 typically surrounds the semiconductor chip structure to protect the fabricated components 108 and the related electrical interconnections, 110, 112 from any cracks propagating from a die separation area 120 located between semiconductor chips, for example 106 and 118, during chip separation/singulation. A kerf area 122 is allocated between adjacent chips to accommodate material removed from the mechanical dicing blade typically having a width around 50 μm.

This invention teaches the inclusion of a dicing crackstop or trench surrounding a chip that is intended for 3-D stacking, to be created and processed in such a way as to effect die singulation without requiring use of any mechanical cut (i.e. no saw or laser cut processing required). In addition to the obvious benefits with respect to elimination of potential mechanical (saw) damage, a dicing crackstop on the order of 5-10 μm wide would occupy a much reduced kerf footprint than would be required for a 50 μm blade width, allowing for a potential productivity improvement.

FIGS. 2A-2F illustrate a first embodiment of the present invention including a semiconductor wafer 200 having a front side 202 and a backside 204 having a plurality of semiconductor chips (for example, at 206) fabricated thereupon. Each semiconductor chip has an active area including series of fabricated components 208 (not shown in detail) located in a layer extending across an upper portion of the wafer 200 which may further include a top surface mount electrodes. Bottom surface mounted electrodes 223 may be connected to the electronic components 208 via Through Silicon Vias (TSVs) 209 formed to provide electrical connections between the electrical components 208 and the backside of the wafer 204. TSV 209 may be formed in the wafer 200 prior to device 208 fabrication, after device fabrication but prior to on-chip interconnect fabrication, or after both device fabrication and on-chip interconnect fabrication. A metal crackstop 210 surrounds the active electronic components 208 to protect the active area once the semiconductor chips 206 have been separated by the below described singulation process. The above reference numbers for the first embodiment will be used for the remaining three embodiments of the invention for ease and consistency of reference.

A Dicing Singulation Channel (DSC) or trench 212 (as shown by the bold line in FIGS. 2A-2B) is formed to surround each entire chip 206 area as part of the backside processing, after wafer backside thinning. The DSC 212 may be formed at the same time the TSVs 209 are formed and may be filled with a suitable material 214, as shown in FIG. 2A, for example tungsten, or polysilicon, or even polyimide. Once backside processing of the wafer is complete, FIG. 2B illustrates the wafer front side 202 is attached to either dicing tape 216 or a combination of an adhesive layer 218 and a handle wafer 220 (these reference numbers will be used for the remaining three embodiments of the invention for ease and consistency of reference). FIG. 2B illustrates that a resist 222 may be patterned to the back side 204 of the wafer wherein a wet etch process may remove the filler material 214 from the dicing singulation channel 212. An alternative to using the patterned resist 222 on the backside of the wafer may be to deposit bumps 223 (not shown in FIG. 2B, but in FIGS. 2C-D), over the TSVs 209 to protect from a backside etchant used to remove the filler material 214 from the DSC 212. FIG. 2C illustrates die singulation achieved in a first configuration using a gentle separation force F exerted to each die via the dicing tape 216 such that the continuous sliver of BEOL-level films joined through the kerf defined by a singulation trench is physically broken (see representation of separation lines 224). (This particular chip singulation process is disclosed in "Advanced Dicing Technology for Semiconductor Wafer-Stealth Dicing," Kumagi et al., IEEE TRANSACTIONS ON SEMICONDUCTOR MANUFACTURING, VOL. 20, NO. 3, AUGUST 2007.) Applying the force F to the dicing tape 228 physically separates a portion of the wafer along the dicing singulation channel 212. This physical separation occurs between an interior portion of the dicing singulation channel 212 and the front side 202 of the wafer 200 immediately above the dicing singulation channel 212.

FIG. 2D illustrates die singulation achieved in a second configuration using the adhesive layer 218 and handle wafer 220 via a vacuum pencil die picking machine (not shown) that applies a shearing force F to separate the individual chips 206 from the wafer.

In this manner, very small (50 nm) singulation lines are formed by the dicing singulation channel/singulation trench that allows for increase in chip density on wafer.

FIG. 2E illustrates a method of simultaneously dicing a plurality of chips on a wafer including, forming a plurality of chips on the wafer 250, forming a dicing singulation channel surrounding each of the plurality of chips on a backside of the wafer 252, filling the dicing singulation channel with a filler material 254, either attaching a dicing tape or an adhesive layer and handle wafer combination to the front side of the wafer 256, patterning a resist on the backside of the wafer and removing the filler material from the dicing singulation channel 258. The singulation process may be accomplished using the dicing tape configuration by applying a force to the dicing tape to separate each of the plurality of chips from the wafer from each other along the dicing singulation channel 260. Alternatively, if the adhesive 218 and wafer handle 220 are used, a vacuum pencil die pick machine separates each wafer by applying a shear force to the edges of the chips along the dicing singulation channel 262.

FIGS. 3A-3E further illustrates a second embodiment of the present invention where a deposition process of tungsten, as shown if FIG. 3A, creates a "seam" 302 in the silicon 200 at the dicing singulation channel 300 used to facilitate removal by wet etch in the formation of the empty backside singulation trench 300. Alternatively, the wet etch may be eliminated due to the presence of the seam 302 in the dicing singulation channel 300, especially if the seam material is tungsten. In this instance, bumps 223 cover the TSVs 209 to protect from the backside etching process. The dicing singulation channel 300 is partially filed with the seam material 302 in contrast to the filler material 214 of FIG. 2A. FIG. 3B illustrates that once backside processing of the wafer is complete, the wafer front side 202 is attached to either dicing tape 216 or a combination of an adhesive layer 218 and a handle wafer 220. FIG. 3C illustrates die singulation achieved in a first configuration using a gentle separation force F exerted to each die via the dicing tape 216 such that the continuous sliver of BEOL-level films joined through the kerf defined by a singulation trench is physically broken (see representation of separation lines 304). Applying the force F to the dicing tape 228 physically separates a portion of the wafer along the dicing singulation channel 300. This physical separation occurs through the deposited seam material 302 and an interior portion of the dicing singulation channel 300 and the front side 202 of the wafer 200 immediately above the dicing singulation channel 300.

FIG. 3D illustrates die singulation achieved in a second configuration (similar to FIG. 2D) using the adhesive layer 218 and handle wafer 220 via a vacuum pencil die picking machine (not shown) that applies a shearing force F to separate the individual chips 206 from the wafer.

FIG. 3E illustrates a method of simultaneously dicing a plurality of chips on a wafer including forming a plurality of chips on the wafer 350, forming a dicing singulation channel surrounding each of the plurality of chips on the backside of the wafer 352, lining a periphery of the dicing singulation channel with a lining material, where the lining material creates a linear seam along the dicing singulation channel between vertically disposed opposite walls of the dicing singulation channel 354 and either attaching a dicing tape or an adhesive layer and handle wafer combination to the front side of the wafer 356. The singulation process may be accomplished using the dicing tape 216 configuration by applying a force to the dicing tape to separate each of the plurality of chips from the wafer from each other along the dicing singulation channel 358. Alternatively, if the adhesive 218 and wafer handle 220 are used, a vacuum pencil die pick machine separates each wafer by applying a shear force to the edges of the chips along the dicing singulation channel 360.

FIGS. 4A-4F illustrate a third embodiment of the present invention where the dicing singulation channel 400 filled with filler material 402 (in similar manner to 214 of FIG. 2A) is formed is placed so as to be vertically coincident with a BEOL singulation channel structure 404 proceeding from the front side 202 of the chip. FIG. 4B illustrates the removal of the singulation channel structure 404 and the filler material 402 through a front side wet etch process or any other suitable selective material removal process. Once the front side processing of the wafer is complete, FIG. 4C illustrates the wafer front side 202 is attached to either dicing tape 216 or a combination of an adhesive layer 218 and a handle wafer 220, and the wafer undergoes a backside thinning process to remove material to a level 406 to expose the dicing singulation channel 400 thereby effectively separating each of the chips from the wafer. FIG. 4D illustrates the addition of bumps 223 deposited on TSVs 209 and further separation of the chips in a first configuration using a gentle separation force F exerted to each die via the dicing tape 216 to further separate the chips retained by the dicing tape 216.

FIG. 4E illustrates further separation of the chips in a second configuration using the adhesive layer 218 and handle wafer 220 via a vacuum pencil die picking machine (not shown) that applies a shearing force F to further separate the individual chips 206 retained by the adhesive 218 and the handle wafer 220.

FIG. 4F illustrates a method of simultaneously dicing a plurality of chips on a wafer including forming a plurality of chips on the wafer 450, forming a through silicon via (TSV) aligned with a metal crackstop structure on the front side of the wafer 452 either, before Front End Of Line (FEOL) processing, after Back End Of Line (BEOL) processing, or after FEOL but before BEOL processing. The metal crackstop structure and the TSV is removed to create a dicing singulation channel 454, and either attaching a dicing tape or an adhesive layer and handle wafer combination to the front side of the wafer 456. The wafer is backside thinned into the dicing singulation channel 458 exposing the channel and initially separating the plurality of chips from adjacent chips on the wafer. The singulation process may be further accomplished by using the dicing tape 216 configuration to apply a force to separate each of the plurality of chips from the wafer from each other along the dicing singulation channel 460. Alternatively, if the adhesive 218 and wafer handle 220 are used, a vacuum pencil die pick machine separates each wafer by applying a shear force to the edges of the chips along the dicing singulation channel 462.

FIGS. 5A-5F illustrate a fourth embodiment of the present invention where the dicing singulation channel 500 is formed between two adjacent through silicon vias (TSVs) 502 adjacent to form a space between the TSVs to be vertically coincident with a BEOL singulation channel structure 504 proceeding from the front side 202 of the chip. FIG. 5B illustrates the removal of the singulation channel structure 504 and the substrate material between the adjacent TSVs 502 through a front side wet etch process or any other suitable material removal process. Once the front side processing of the wafer is complete, FIG. 5C illustrates the wafer front side 202 is attached to either dicing tape 216 or a combination of an adhesive layer 218 and a handle wafer 220, and the wafer undergoes a backside thinning process to remove material to a level 506 to expose the dicing singulation channel 500 thereby effectively separating each of the chips from the wafer. FIG. 5D illustrates the addition of bumps 223 deposited on TSVs 209 and further separation of the chips in a first configuration using a gentle separation force F exerted to each die via the dicing tape 216 to further separate the chips retained by the dicing tape 216.

FIG. 5E illustrates a further separation of the chips in a second configuration using the adhesive layer 218 and handle wafer 220 via a vacuum pencil die picking machine (not shown) that applies a shearing force F to further separate the individual chips 206 retained by the adhesive 218 and the handle wafer 220.

FIG. 5F illustrates a method of simultaneously dicing a plurality of chips on a wafer including forming a plurality of chips on the wafer 550, forming a through silicon vias (TSVs) below and adjacent to a metal crackstop structure on the front side of the wafer 552 either, before Front End Of Line (FEOL) processing, after Back End Of Line (BEOL) processing, or after FEOL but before BEOL processing. The metal crackstop structure and the material between the TSVs are removed to create a dicing singulation channel 554, and either attaching a dicing tape or an adhesive layer and handle wafer combination to the front side of the wafer 556. The wafer is backside thinned into the dicing singulation channel 558 exposing the channel and initially separating the plurality of chips from adjacent chips on the wafer. The singulation process may be further accomplished by using the dicing tape 216 configuration to apply a force to separate each of the plurality of chips from the wafer from each other along the dicing singulation channel 460. Alternatively, if the adhesive 218 and wafer handle 220 are used, a vacuum pencil die pick machine separates each wafer by applying a shear force to the edges of the chips along the dicing singulation channel 462.

One exemplary method of the present invention includes receiving at least one wafer 200 having a front side 202 and a backside 204, where the front side has a plurality of integrated circuit chips 208 thereon. Each of the dicing trenches 212 are positioned opposite a location on the front side of the wafer 202 that corresponds to edges of each of the plurality of chips 208. The dicing trenches 212 are filled with a filler material 226 and a dicing support 328 is attached to a front side of the wafer 204. The filler material 226 is removed 360 from the dicing trenches 212, and a force F is applied to the dicing support 216 or a handle wafer 220 to separate each of the plurality of chips 208 on the wafer 200 from each other along the dicing trenches 212.

The dicing trenches 212 are approximately 50 nm in width. The filler material 214 may include tungsten, polysilicon or polyimide. The force F applied to the dicing support 216 or handle wafer 220 physically separates a portion of the wafer 200 along the dicing trenches 212. Physical separation occurs between an interior portion of the dicing trenches 212 and the front side of the wafer 202 immediately above the dicing trenches 212. The filler material 214 removed from the dicing trenches may be performed by a wet etch process 258. The dicing trenches 212 corresponding to rectangular edges of the wafers 200 forming a continuous and separate rectangular trench 212 corresponding to each of the chips 208, each chip on the front side 202 of the wafer 200 having a corresponding rectangular trench on the backside of the wafer 204 matching a shape and position of the edges of the chips 208 on the front side of the wafer 202.

Another exemplary method of the present invention includes receiving at least one wafer 200, where a pattern of material is removed from the backside of the wafer 204 to form a plurality of dicing trenches 212, wherein the dicing trenches 212 are aligned to contact with at least one metal crackstop structure 404/505 disposed on a front side 202 of the wafer. The dicing trenches 212 may be filled with a filler material 402, and a dicing support 216/218/220 is attached to a front side of the wafer 202. The filler material 402 is removed from the dicing trenches 212, and a force F is applied to the dicing support 216/218/220 to separate each of the plurality of chips 208 on the wafer from each other along the dicing trenches 212.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method comprising:
   receiving a wafer, said wafer having a front side and a backside, said front side having a plurality of integrated circuit chips thereon;
   thinning said backside of said wafer;
   removing portions of said wafer from said backside of said wafer to form a plurality of dicing trenches, each of said dicing trenches being positioned opposite a location on said front side of said wafer that corresponds to an edge of each of said plurality of chips;
   filling said dicing trenches with a filler material;
   attaching a dicing support, comprising one of dicing tape and a combination an adhesive layer and a handle layer, to said front side of said wafer;
   removing said filler material from said dicing trenches; and
   applying one of a lateral force and shearing force to said front side of said wafer and to said dicing support to physically break back-end-of-line films joined through a kerf defined by each of said dicing trenches.

2. The method according to claim 1, said dicing trenches being approximately 50 nm in width.

3. The method according to claim 1, said filler material comprising one of tungsten, polysilicon and polyimide.

4. The method according to claim 1, said removing of said filler material from said dicing trenches further comprising a wet etch process.

5. The method according to claim 1, said dicing trenches corresponding to rectangular edges of said wafers, said dicing trenches forming a continuous and separate rectangular trench corresponding to each of said plurality of chips, and said each of said plurality of chips on said front side of said wafer having a corresponding rectangular trench on said backside of said wafer matching a shape and position of said edges of said each of said plurality of chips on said front side of said wafer.

6. The method according to claim 1, said removing of said filler material leaves a portion of said filler material to create a linear seam along said dicing trenches between vertically disposed opposite walls of said dicing trenches; and
   said applying one of a lateral force and shearing force to said front side of said wafer and to said dicing support separates each of said plurality of chips on said wafer from each other along said linear seam of said filler material.

7. A method comprising:
   receiving at least one wafer, said wafer having a front side and a backside, said front side having a plurality of integrated circuit chips thereon;
   thinning said backside of said wafer;
   removing a pattern of material from said backside of said wafer to form a plurality of dicing trenches, each of said dicing trenches being positioned opposite a location on said front side of said wafer that corresponds to edges of each of said plurality of chips;

lining a periphery of said dicing trenches with a lining material, wherein said lining material creates a linear seam along said dicing trenches between vertically disposed opposite walls of said dicing trenches;

attaching a dicing support to said front side of said wafer; and applying a force to said dicing support to separate each of said plurality of chips on said wafer from each other along each of said dicing trenches and said linear seam of said lining material.

8. The method according to claim 7, said dicing trenches kerf being approximately 50 nm in width.

9. The method according to claim 7, said lining material comprising a tungsten deposition.

10. The method according to claim 7, said applying of said force to said dicing support physically separating a portion of said wafer along said dicing trenches.

11. The method according to claim 10, said physically separating occurring between an interior portion of said dicing trenches and said front side of said wafer immediately above said dicing trenches.

12. The method according to claim 7, said dicing trenches corresponding to rectangular edges of said wafers, said dicing trenches forming a continuous and separate rectangular trench corresponding to each of said plurality of chips, and said each of said plurality of chips on said front side of said wafer having a corresponding rectangular trench on said backside of said wafer matching a shape and position of said edges of said each of said plurality of chips on said front side of said wafer.

13. The method according to claim 7, said dicing support being attached to said wafer after all backside processing to said wafer is complete.

14. A method comprising:

receiving a wafer, said wafer having a front side and a backside, said front side having a plurality of integrated circuit chips thereon;

removing portions of said wafer from said backside of said wafer to form a plurality of singulation trenches, each of said singulation trenches being positioned opposite a location on said front side of said wafer that corresponds to an edge of each of said plurality of chips;

filling said singulation trenches with a filler material;

attaching a dicing support to said front side of said wafer;

wet etching said backside of said wafer to remove said filler material from vertically disposed opposite walls and a bottom surface of each of said singulation trenches; and applying one of a lateral force and shearing force to said front side of said wafer and to said dicing support to physically break back-end-of-line films joined through a kerf defined by each of said singulation trenches.

15. The method according to claim 14, said removing of said filler material leaves a portion of said filler material to create a linear seam along said singulation trenches between vertically disposed opposite walls of said singulation trenches; and said applying one of a lateral force and shearing force to said front side of said wafer and to said dicing support separates each of said plurality of chips on said wafer from each other along said linear seam of said filler material.

16. The method according to claim 14, said singulation trenches being approximately 50 nm in width.

17. The method according to claim 14, said filler material comprising one of tungsten, polysilicon and polyimide.

18. The method according to claim 14, said removing of said filler material from said singulation trenches further comprising a wet etch process.

19. The method according to claim 14, said singulation trenches corresponding to rectangular edges of said wafers, said singulation trenches forming a continuous and separate rectangular trench corresponding to each of said plurality of chips, and said each of said plurality of chips on said front side of said wafer having a corresponding rectangular trench on said backside of said wafer matching a shape and position of said edges of said each of said plurality of chips on said front side of said wafer.

* * * * *